United States Patent
Tan et al.

(10) Patent No.: US 10,270,446 B2
(45) Date of Patent: Apr. 23, 2019

(54) BUFFER CIRCUIT

(71) Applicant: LITE-ON SINGAPORE PTE. LTD., Midview (SG)

(72) Inventors: Meng-Tong Tan, Midview (SG); Huey-Jen Lim, Midview (SG); You-Fa Wang, Singapore (SG)

(73) Assignee: LITE-ON SINGAPORE PTE. LTD., Midview (SG)

( * ) Notice: Subject to any disclaimer, the term of this patent is extended or adjusted under 35 U.S.C. 154(b) by 30 days.

(21) Appl. No.: 15/481,584

(22) Filed: Apr. 7, 2017

(65) Prior Publication Data
US 2018/0294812 A1 Oct. 11, 2018

(51) Int. Cl.
*H03K 19/0175* (2006.01)

(52) U.S. Cl.
CPC .............................. *H03K 19/017536* (2013.01)

(58) Field of Classification Search
CPC ............. H03K 17/00; H03K 17/04126; H03K 17/063; H03K 17/0826; H03K 17/567; H03K 17/601; H03K 19/00; H03K 19/017536; H03K 2217/00; H03K 2217/0036
USPC ........................................................ 327/109
See application file for complete search history.

(56) References Cited

U.S. PATENT DOCUMENTS 6,650,168 B1 * 11/2003 Wang ............... H03K 3/356113
                                                327/333
7,259,614 B1 *  8/2007 Baker ...................... G05F 1/46
                                                323/311

\* cited by examiner

*Primary Examiner* — Lincoln D Donovan
*Assistant Examiner* — Dave Mattison
(74) *Attorney, Agent, or Firm* — Li & Cai Intellectual Property (USA) Office (57) ABSTRACT

A buffer circuit receives a working supply voltage which may vary within a voltage range. The buffer circuit has a high voltage constant current buffer circuit, and in this circuit, the source of the first NMOS transistor is grounded, and drains of the first NMOS transistor and the first PMOS transistor are connected. The source of the second PMOS transistor is connected to the supply voltage input of the buffer circuit, and the drain of the second PMOS transistor is connected to the source of the first PMOS transistor. The input end of the high voltage diode connected composite transistors is connected to the supply voltage input of the buffer circuit, and the output end of the diode connected transistors is connected to the gates of first and second PMOS transistors. The first PMOS and NMOS transistors are high-voltage transistors. The second PMOS transistor is a low-voltage transistor.

10 Claims, 5 Drawing Sheets

BUFFER CIRCUIT

BACKGROUND OF THE INVENTION

1. Field of the Invention

The instant disclosure relates to a high voltage constant current buffer driver circuit; in particular, to a buffer circuit that can provide a stable output current even when operating at different supply voltages that are within a wide voltage range.

2. Description of Related Art

A high voltage constant current buffer driver circuit is often used in an Intelligent Power Module (IPM) to provide a sufficient driving power to drive a NPN bipolar junction transistor (BJT). Thus, the current provided by the buffer circuit to drive the BJT cannot be too large. If the base current provided by the buffer circuit to drive the BJT is too large, the BJT will be over driven and the storage time of the BJT will be increased, and thereby the propagation delay of the output of the Intelligent Power Module (IPM) will be increased.

Figure 1:
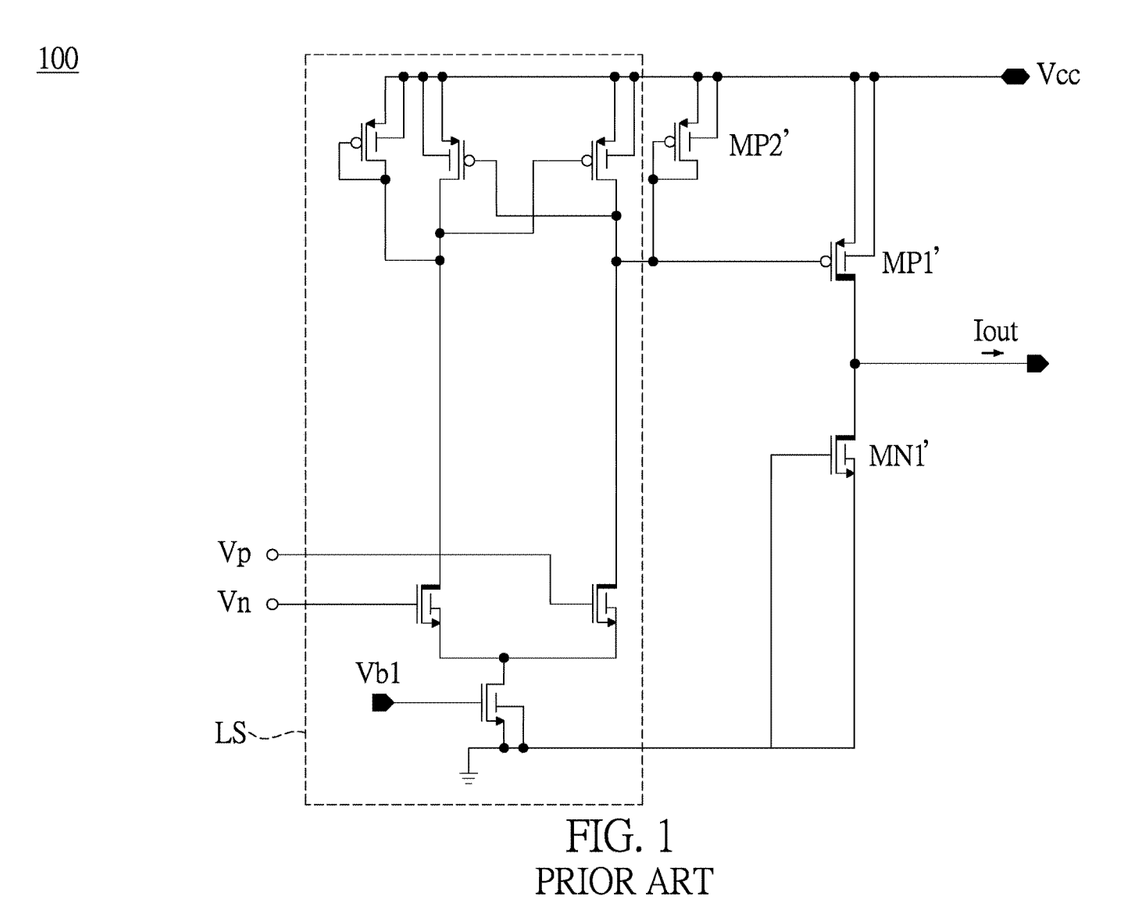
FIG. 1 shows a circuit diagram of a conventional constant current buffer circuit.

Referring to FIG. 1, FIG. 1 shows a circuit diagram of a conventional constant current buffer circuit. As shown in FIG. 1, to be able to operate at a supply voltage that may vary within a wide voltage range, there are an NMOS transistor MN1' and a PMOS current mirror comprising PMOS transistors MP1' and MP2', configured in the conventional constant current buffer circuit 100. Specifically, the NMOS transistor MN1' and the PMOS transistor MP1' need to be high-voltage transistors. The PMOS transistor MP2' is configured as a diode connected transistor to clamp the voltage at the output of the level shifter LS and the gate of the PMOS transistor MP1' to a predetermined voltage. The source of the PMOS transistor MP1' is connected to the supply voltage of the buffer circuit 100 to receive the supply voltage. The gate and drain of the diode connected PMOS transistor MP2' are connected together, and they are further connected to the gate of the PMOS transistor MP1'.

Even though in this manner the buffer circuit 100 can operate at a supply voltage that may vary within a wide voltage range, the output current of the buffer circuit 100 will also vary with the changes of the supply voltage. Especially, the output current of the buffer circuit 100 will dramatically increase when the supply voltage of the buffer circuit 100 increases. Thus, if the buffer circuit 100 is used in an Intelligent Power Module (IPM), the NPN BJT power transistor which is a load to the buffer may be over driven by a large output current and thus there will be an increase in propagation delay of the output of the Intelligent Power Module (IPM).

SUMMARY OF THE INVENTION

Figure 2:
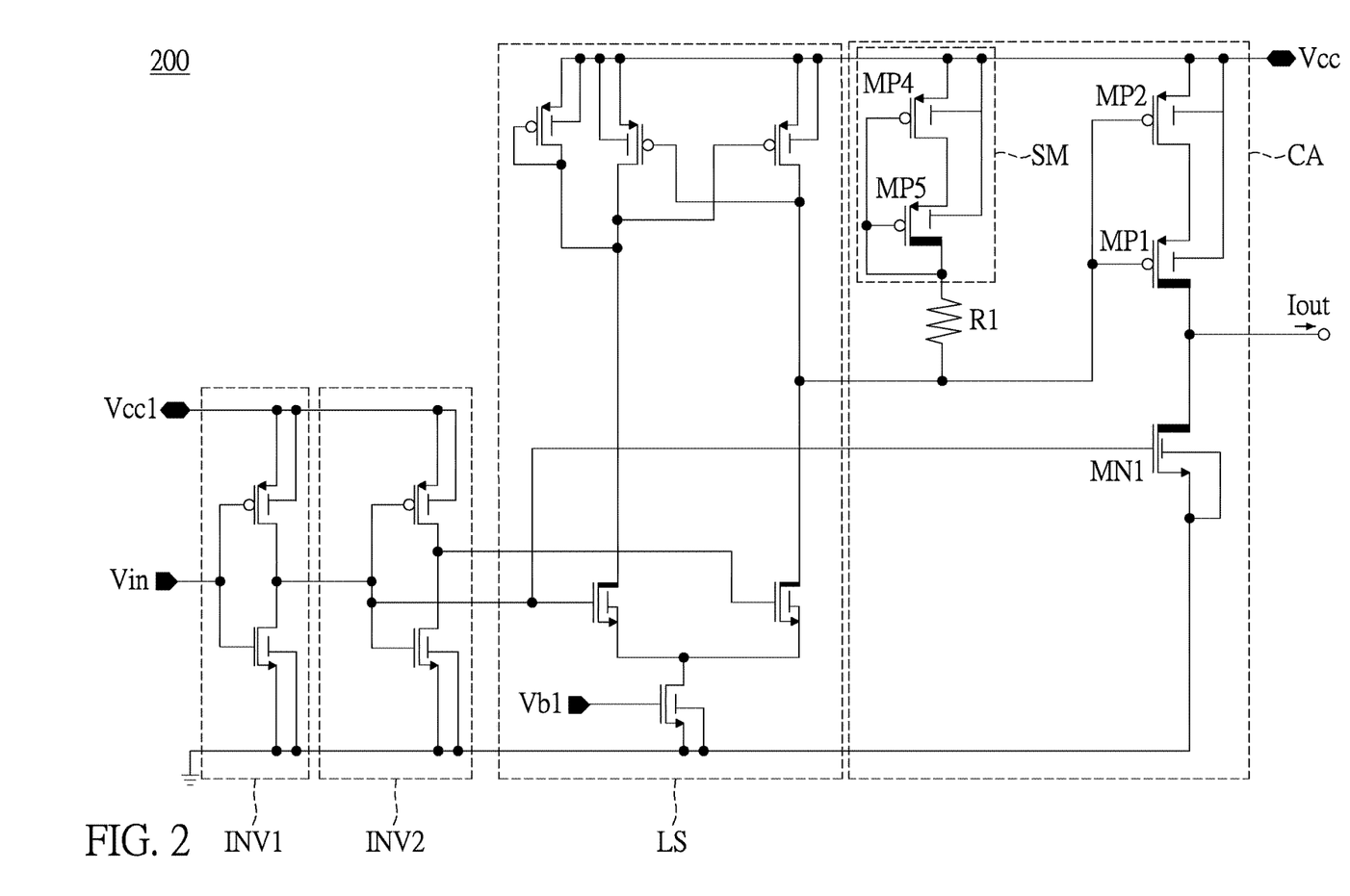
FIG. 2 shows a circuit diagram of a high voltage constant current buffer circuit of one embodiment of the instant disclosure.

The instant disclosure provides a constant current buffer circuit as shown in FIG. 2. The buffer circuit operates at a supply voltage received by its input end. The supply voltage of the buffer circuit is controlled within a wide voltage range. This buffer circuit comprises a high voltage current mirror and a first NMOS transistor. The high voltage current mirror circuit comprises a first PMOS transistor, a second PMOS transistor, a composite diode connected transistor (fourth PMOS and fifth PMOS transistors) and a resistor. The source of the second PMOS transistor is connected to the supply voltage of the buffer circuit, and the drain of the second PMOS transistor is connected to the source of the first PMOS transistor. An input end of the diode connected composite transistors is connected to the supply voltage of the buffer circuit, and an output end of the diode connected composite transistor is connected to the gate of the first PMOS transistor and the gate of the second PMOS transistor. In order to reduce the variation of the output current of the buffer circuit resulting from changes of the supply voltage, a long channel transistor or transistors in a Cascode configuration is needed. However, a high voltage transistor with long channel will take up a large IC area. On the other hand, a current mirror in a Cascode configuration will require additional biasing circuitry. To save the IC area and additional biasing circuitry, the second PMOS transistor in the current mirror is configured as a low-voltage PMOS transistor and the first PMOS transistor as a high-voltage PMOS transistor, to form a high voltage long channel composite transistor. The first NMOS transistor is also configured as a high-voltage NMOS transistor for high voltage operation at the output. The source of the first NMOS transistor is grounded, and the drain of the first PMOS transistor connects to the drain of the first NMOS transistor.

Figure 4:
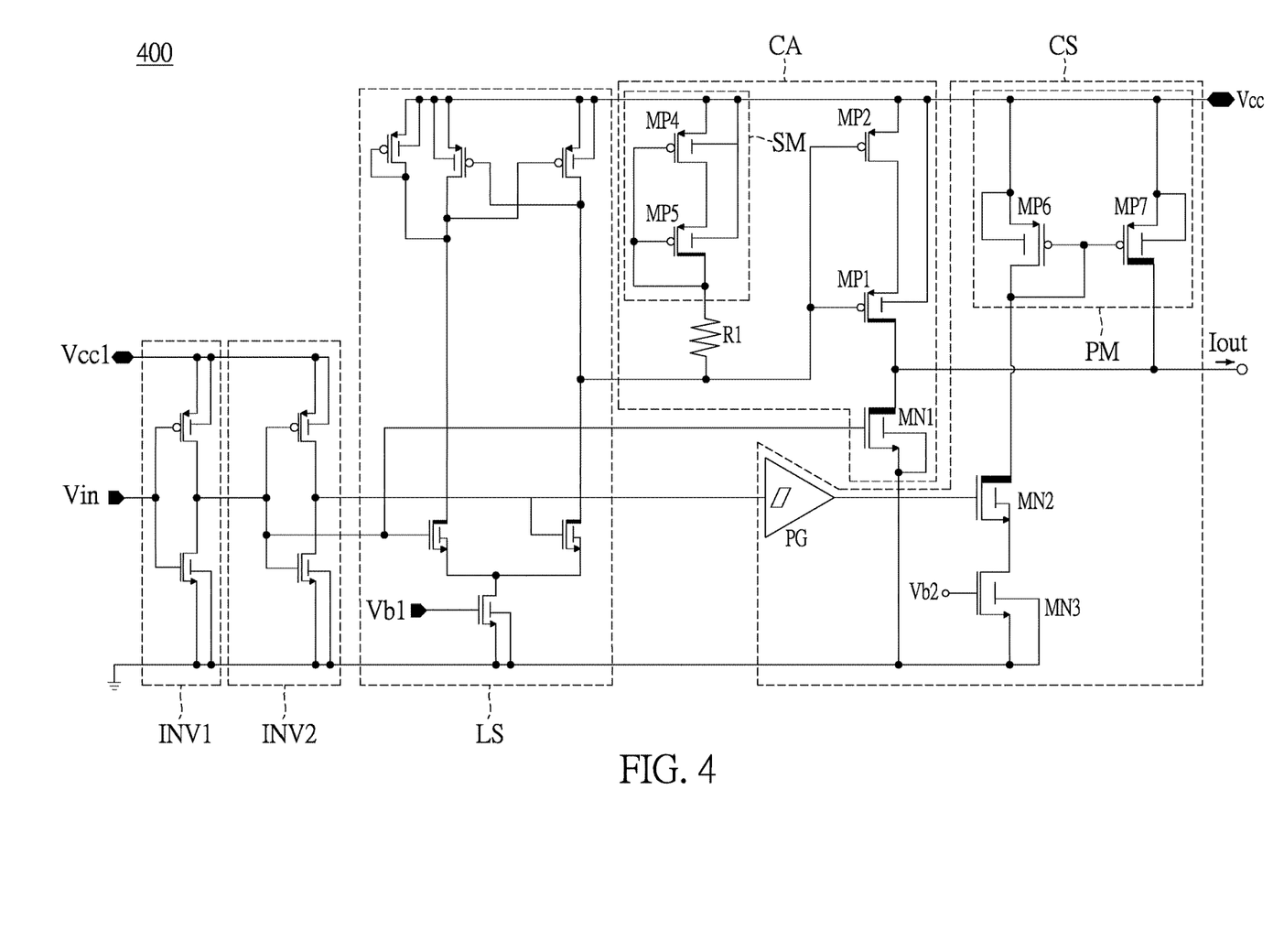
FIG. 4 shows a circuit diagram of a circuit of another embodiment of the instant disclosure.

In one embodiment of the buffer circuit provided by the instant disclosure, the buffer circuit further comprises a transient current boosting circuit CS as shown in FIG. 4. The transient current boosting circuit connects to the input of the high voltage constant current buffer circuit. The pulse generator of the transient current boosting circuit receives a signal at the input of the high voltage constant current buffer and sends out a narrow pulse signal to the drive a NMOS transistor MN2. The NMOS transistor MN2 in turn will turn on a PMOS current mirror PM which will generate a narrow pulse output current to boost the output current Iout of the current boosting circuit. As a result, the current boosting circuit directly outputs the narrow pulse boost current when the input of the pulse generator transits from low to high. Thus, the current boosting circuit provides a narrow pulse boost current to the high voltage constant current buffer circuit.

To sum up, the buffer circuit provided by the instant disclosure can operate at a wide voltage range because the first PMOS transistor and the first NMOS transistor configured in the high voltage constant current buffer circuit are designed as high-voltage transistors. In addition, the second PMOS transistor and the diode connected composite transistors are configured to make the buffer circuit able to stably provide a low output current even when operating at various supply voltages. Moreover, when the buffer circuit operates at a low supply voltage, in order to have a stable output current of the buffer circuit, the current boosting circuit can boost the current of the high voltage constant current buffer circuit, and then outputs the boosted current.

For further understanding of the instant disclosure, reference is made to the following detailed description illustrating the embodiments of the instant disclosure. The description is only for illustrating the instant disclosure, not for limiting the scope of the claims.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It will be understood that, although the terms first, second, third, and the like, may be used herein to describe various elements, but these elements should not be limited by these terms. These terms are only to distinguish one element from another region or section. For example, a first element discussed below could be termed a second element, and, similarly, a second element could be termed a first element, without departing from the teachings of the instant disclosure. As used herein, the term "and/or" includes any and all combinations of one or more of the associated listed items.

[One Embodiment of the Buffer Circuit]

Referring to FIG. 2, FIG. 2 shows a circuit diagram of a constant current buffer circuit of one embodiment of the instant disclosure. The buffer circuit 200 at least comprises a High Voltage Constant Current Buffer circuit CA. As shown in FIG. 2, the input end Vin of the high voltage constant current buffer circuit CA is just the input end of the buffer circuit 200. The buffer circuit 200 operates at a supply voltage Vcc that is received by the supply input end of the buffer circuit 200. Thus the supply voltage Vcc is controlled within a voltage range. In this embodiment, the voltage range of the supply voltage provided to the buffer circuit 200 is wide and set from 4.5V to 30V. In order to make the buffer circuit 200 able to operate at the supply voltage Vcc that may vary from 4.5V to 30V, the high voltage constant current buffer circuit CA comprises a first PMOS transistor MP1 and a first NMOS transistor MN1. The source of the first NMOS transistor MN1 is grounded, and the drain of the first PMOS transistor MP1 is connected to the drain of the first NMOS transistor MN1. In addition, the first PMOS transistor MP1 is designed as a high-voltage PMOS transistor and the first NMOS transistor MN1 is designed as a high-voltage NMOS transistor to make the buffer circuit 200 able to operate at a high supply voltage Vcc, such as 30V.

Different from the conventional constant current buffer circuit 100 shown in FIG. 1, in this embodiment, the high voltage constant current buffer circuit CA further comprises a second PMOS transistor MP2, a composite diode connected transistor SM and a resistor R1. Again referring to FIG. 2, the source of the second PMOS transistor MP2 is connected to the supply voltage Vcc of CA, and the drain of the second PMOS transistor MP2 is connected to the source of the first PMOS transistor MP1. In addition, the source of the fourth PMOS transistor MP4 of the diode connected composite transistors SM is connected to the supply voltage of the high voltage constant current buffer CA, and the output end of the diode connected composite transistors SM is connected to one end of resistor R1. The other end of resistor R1 is connected to the gate of the first PMOS transistor MP1 and the gate of the second PMOS transistor MP2. In this manner, the voltage of the gate of the first PMOS transistor MP1 and the voltage of the gate of the second PMOS transistor MP2 are controlled by the diode connected composite transistors SM and resistor R1.

Further, the composite diode connected transistor SM comprises a fourth PMOS transistor MP4 and a fifth PMOS transistor MP5 that are connected in series. The fourth PMOS transistor MP4 needs to be designed as a low-voltage PMOS transistor and the fifth PMOS transistor MP5 needs to be designed as a high-voltage PMOS transistor so that they are identical in structure and proportional in size in comparison to the composite transistors MP1 and MP2 of the high voltage current mirror. The source of the fourth PMOS transistor MP4 is connected to the supply voltage diode connected composite transistors SM, and the drain of the fifth PMOS transistor MP5 is the output end of the diode connected composite transistors SM. The drain of the fourth PMOS transistor MP4 is connected to the source of the fifth PMOS transistor MP5.

In another embodiment, the high voltage constant current buffer circuit CA further comprises a resistor R1 connected between the diode connected composite transistors SM and the gates of the first PMOS transistor MP1 and the second PMOS transistor MP2 as shown in FIG. 2. Specifically speaking, the drain of the fifth PMOS transistor MP5 and the gates of the fourth PMOS transistor MP4 and the fifth PMOS transistor MP5 are all connected to the first resistor R1. The bias voltage of the fourth PMOS transistor MP4 and the bias voltage of the fifth PMOS transistor MP5 are easily affected by the variation of the circuit temperature, so the resistor R1 is configured to provide temperature compensation. In other words, the resistor R1 can help the fourth PMOS transistor MP4 and the fifth PMOS transistor MP5 to lower their sensitivities to temperature variations.

Figure 3:
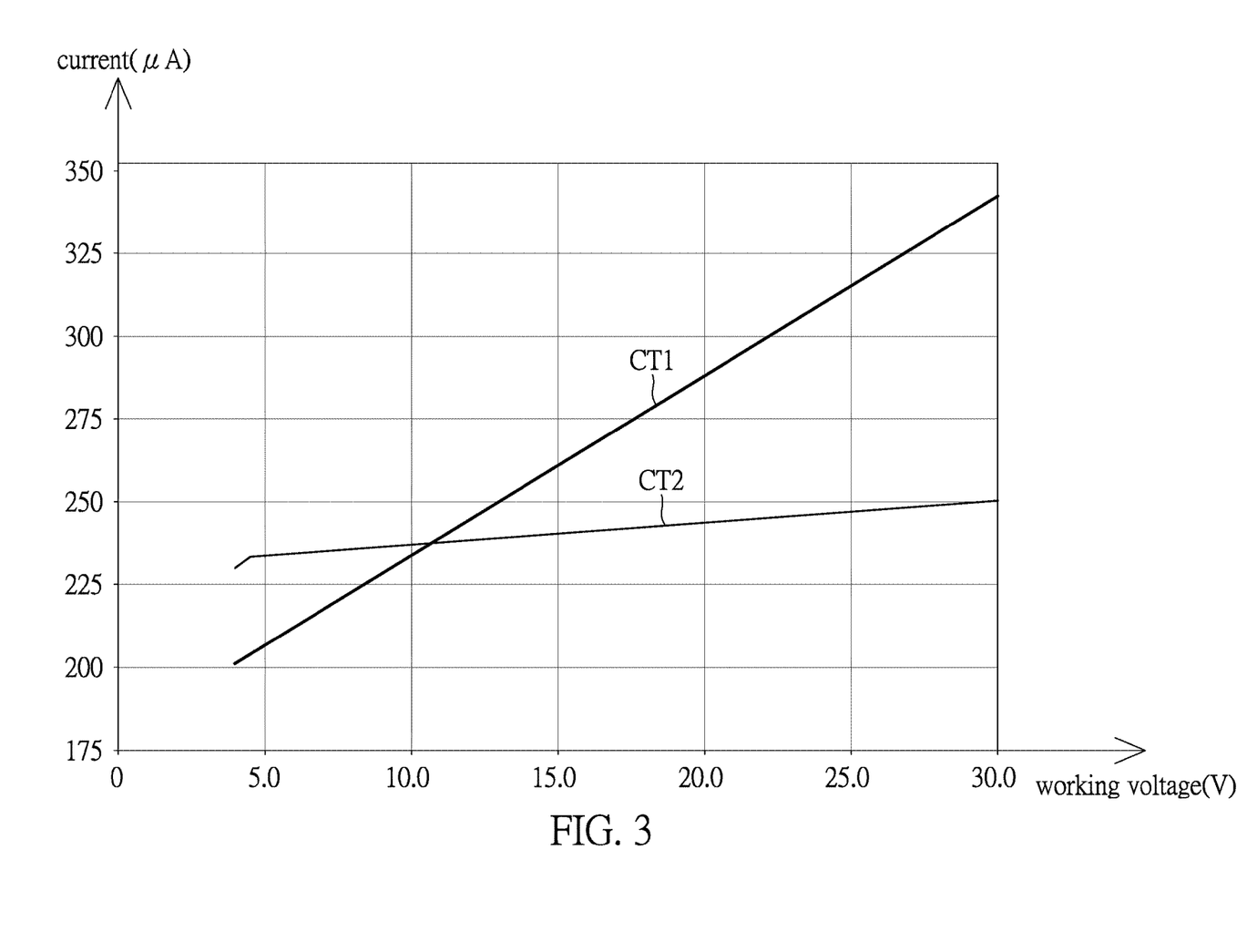
FIG. 3 shows a waveform diagram indicating the relationship between the output current and the supply voltage of the high voltage constant current buffer circuits shown in FIG. 1 and FIG. 2.

Moreover, the gate of the fourth PMOS transistor MP4 and the gate of the fifth PMOS transistor MP5 are connected, and thus the output impedance of the diode connected composite transistors SM increases. This decreases the variation of the output current Iout of the buffer circuit 200 when the buffer circuit 200 operates at different supply voltages Vcc. Referring to FIG. 3, FIG. 3 shows a waveform diagram indicating the relationship between the output current and the supply voltage of the buffer circuits shown in FIG. 1 and FIG. 2. As shown in FIG. 3, when the supply voltage Vin of the conventional constant current buffer circuit 100 varies from 5V to 35V, the output current of the conventional constant current buffer circuit 100 raises roughly from 200 μA to 350 μA (as shown by the curve CT1 in FIG. 3). However, when the supply voltage Vin of the buffer circuit 200 provided in this embodiment varies from 5V to 35V, the output current of the buffer circuit 200 raises just roughly from 225 μA to 250 μA (as shown by the curve CT2 in FIG. 3). In other words, when operating at different supply voltages Vcc, the variation of the output current Iout of the conventional constant current buffer circuit 100 is greater (350 μA−200 μA=150 μA), because there is only a PMOS transistor MP1' configured in the traditional buffer circuit 100. On the other hand, when operating at different supply voltages Vcc, the variation of the output current Iout of the buffer circuit 200 provided in this embodiment is lesser (250 μA−225 μA=25 μA), because there is a composite long channel transistors and a diode connected composite transistors mirror SM configured in the buffer circuit 200 provided in this embodiment.

Specifically speaking, again referring to FIG. 3, compared with the conventional constant current buffer circuit 100, when operating at different supply voltages Vcc, the buffer circuit 200 provided in this embodiment not only has a lesser variation of the output current Iout but also has a smaller output current Iout. Generally, an optical coupler can operate within a great voltage range but can only operate at small bias current. There will be a propagation delay of the output of an Intelligent Power Module (IPM), if the current outputted from the buffer circuit to the NPN BJT Power Transistor in optical coupler is too large. Thus, according to the above, the buffer circuit 200 provided in this embodiment can be used well in the general Intelligent Power Module (IPM) to drive the NPN BJT load by its output current.

Additionally, again referring to FIG. 2, to provide enough voltage to the high voltage constant current buffer circuit CA, there are two inverters INV1 and INV2 and a level shifter LS connecting to the high voltage constant current buffer circuit CA as shown in FIG. 2. Specifically speaking, the inverter INV1 is connected to the inverter INV2 and receives the supply voltages Vcc1, the inverter INV2 is also connected to the level shifter LS. The level shifter LS is configured to raise the received supply voltages Vcc1 and then provide the raised supply voltages Vcc to the high voltage constant current buffer circuit CA.

According to FIG. 2, the inverter INV1 can be a CMOS inverter comprising one NMOS transistor and one PMOS transistor, and also the inverter INV2 can be a CMOS inverter comprising one NMOS transistor and one PMOS transistor. In addition, the level shifter LS can comprise three PMOS transistors and three NMOS transistors as shown in FIG. 2. It is worth mentioning that, because the level shifter LS is configured to raise the received supply voltages Vcc, in the level shifter LS in FIG. 2, two of the NMOS transistors are high-voltage NMOS transistors to stand the high voltage.

In order to further illustrate the buffer circuit provided by the instant disclosure, there is another embodiment provided in the following description.

In the following embodiment, only parts different from embodiment in FIG. 2 are described, and the omitted parts are indicated to be identical to the embodiment in FIG. 2. In addition, for easy instruction, similar reference numbers or symbols refer to the same elements.

[One Embodiment of the Buffer Circuit]

Referring to FIG. 4, FIG. 4 shows a circuit diagram of a circuit of another embodiment of the instant disclosure. A difference between the buffer circuit 300 in this embodiment and the buffer circuit 200 in the embodiment shown by FIG. 2 is that, in addition to the high voltage constant current buffer circuit CA, the buffer circuit 300 in this embodiment further comprises a transient current boosting circuit CS.

As shown in FIG. 4, the current boosting circuit CS comprises a pulse generator PG, a PMOS current mirror PM, a second NMOS transistor NM2 and a third NMOS transistor NM3. The gate of the second NMOS transistor NM2 is connected to the output of the pulse generator PG, and the drain of the second NMOS transistor NM2 is connected to the input of the PMOS current mirror PM. In addition, the drain of the third NMOS transistor NM3 is connected to source of the second NMOS transistor NM2. The source of the third NMOS transistor NM3 is grounded and a buffer bias voltage Vb2 is received by the gate of the third NMOS transistor NM3.

Moreover, the PMOS current mirror PM comprises a sixth PMOS transistor MP6 and a seventh PMOS transistor MP7 with their gates connected together. Sources of the sixth PMOS transistor MP6 and the seventh PMOS transistor MP7 are connected to the supply voltage of the buffer circuit 300. The gate and drain of the sixth PMOS transistor MP6 and the gate of the seventh PMOS transistor MP7 are all connected to the drain of the second NMOS transistor MN2.

Specifically speaking, again referring to FIG. 4, the voltage received by the input end of the pulse generator PG is equal to the input signal received by the input of the buffer circuit 300. The pulse generator generates a narrow pulse to turn on the PMOS current mirror PM when the input signal transits from low to high. The third NMOS transistor MN3 is configured as a current source. The second NMOS transistor MN2 is configured as a switch and the gate of MN2 is connected to the output of the pulse generator. The NMOS transistor MN2 is used to turn on the current from the current source in MN3. When the NMOS transistor NM2 is turned on, the PMOS current mirror will be turned on and a boost current from the PMOS current mirror will be sent to the output of the high voltage constant current buffer. Finally, the current boosting circuit CS outputs the increased current as the output current Iout of the buffer circuit 300.

Figure 5:
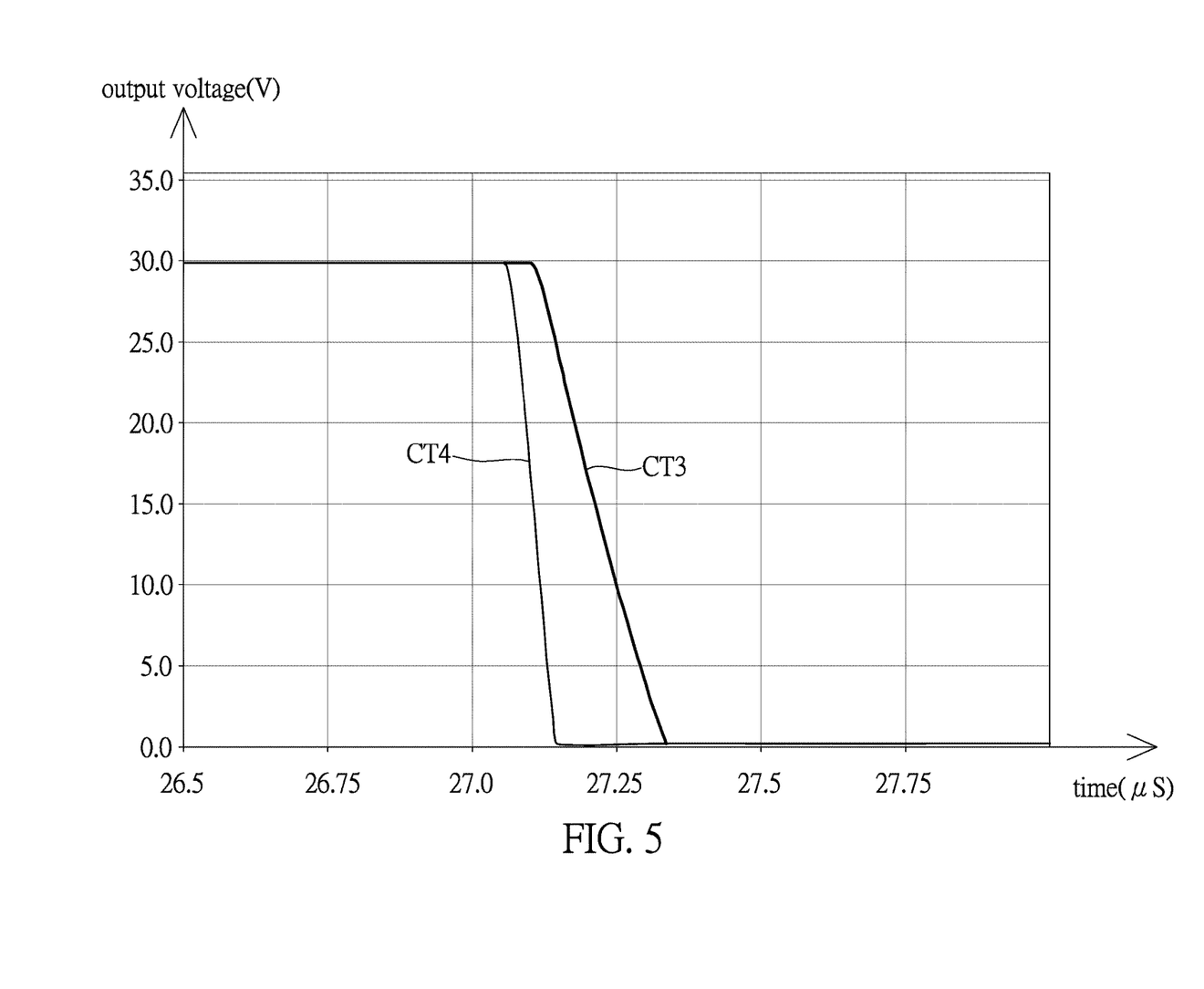
FIG. 5 shows a waveform diagram indicating the relationship between the time and the output voltage of an optical coupler driven by the constant current buffer circuits shown in FIG. 2 and FIG. 4.

The reason why there is a need to have a transient current boosting circuit CS configured in the buffer circuit 300 is illustrated as follows. Like the buffer circuit 200 shown in FIG. 2, the buffer circuit 300 provided in this embodiment can also be used in a general Intelligent Power Module (IPM). Referring to FIG. 5, FIG. 5 shows a waveform diagram indicating the relationship between the time and the output voltage of an Intelligent Power Module (IPM) optical coupler driven by the buffer circuits shown in FIG. 2 and FIG. 4. As shown in FIG. 5, when the buffer circuit 200 shown in FIG. 2 operates at a small supply voltage Vcc, the high voltage current source circuit CA outputs a current as the output current Iout of the buffer circuit 200 to drive an NPN BJT Power Transistor (not shown). Under this circumstance, the fall time of the output voltage of the NPN BJT transistor is roughly 0.06 μS (as shown by the curve CT3 in FIG. 5). Differently, when the buffer circuit 300 in this embodiment operates at a small supply voltage Vcc, the current outputted by the high voltage constant current source circuit CA will be increased by adding an extra current and this extra current is provided by the current boosting circuit CS. After that, the current boosting circuit CS outputs the increased current as the output current Iout of the buffer circuit 300 to drive the NPN BJT Power Transistor (not shown). Under this circumstance, the fall time of the output voltage of the optical coupler is roughly 0.04 μS (as shown by the curve CT4 in FIG. 5). Thus, by using the buffer circuit 300 in an optical coupler, the fall time of the output voltage of the optical coupler can be shortened.

Additionally, it is worth mentioning that, in this embodiment, the second NMOS transistor NM2 configured in the current boosting circuit CS is designed as a high-voltage NMOS transistor, and the sixth PMOS transistor MP6 and the seventh PMOS transistor MP7 configured in the current mirror PM are respectively designed as a low-voltage PMOS transistor and a high-voltage PMOS transistor respectively. Because the seventh PMOS transistor MP7 configured in the current mirror PM is a high-voltage PMOS transistor, the current boosting circuit CS will not be damaged when the buffer circuit 300 operates at a large supply voltage Vcc, such as 30V.

To sum up, the buffer circuit provided by the instant disclosure can operate at a working voltage that can varies within a wide voltage range, such as 4.5V~30V, and at least has the advantages as follows.

When the buffer circuit provided by the instant disclosure is used in an Intelligent Power Module (IPM), the buffer circuit provided by the instant disclosure can stably provide a low output current even when working at different working voltages that are within a wide voltage range, such as 4.5V~30V. Thus, the NPN output transistor of an optical coupler in the Intelligent Power Module (IPM) will not be over driven and the long propagation delay of the output of the Intelligent Power Module (IPM) can be avoided.

In addition, there is a current boosting circuit configured in the buffer circuit provided by the instant disclosure. When the buffer circuit operates at a small supply voltage, the current outputted from the high voltage constant current buffer circuit will first be increased by adding an extra current provided by the current boosting circuit, and then be outputted as the output current of the buffer circuit to drive an NPN BJT transistor in the Intelligent Power Module (IPM). In this manner, the fall time of the output voltage of the IPM can be shortened.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A buffer circuit, operating at a working voltage received by its input end, wherein the working voltage is controlled within a voltage range, the buffer circuit comprising:
    a high voltage constant current buffer circuit, comprising:
        a first PMOS transistor and a first NMOS transistor, the source of the first NMOS transistor being grounded, and the drain of the first PMOS transistor connecting to the drain of the first NMOS transistor and an output end of the buffer circuit;
        a second PMOS transistor, the source of the second PMOS transistor connecting to the supply voltage of the high voltage constant current buffer circuit, and the drain of the second PMOS transistor connecting to the source of the first PMOS transistor; and
    a high voltage diode connected composite transistors, an input end of the high voltage diode connected composite transistors connecting to the supply voltage of the high voltage constant current buffer circuit, an output end of the high voltage diode connected composite transistors connecting to the gate of the first PMOS transistor and the gate of the second PMOS transistor;
    wherein the second PMOS transistor in the high voltage constant current buffer circuit is a low-voltage PMOS transistor, the first PMOS transistor in the high voltage constant current buffer circuit is a high-voltage PMOS transistor, and the first NMOS transistor in the high voltage constant current buffer circuit is a high-voltage NMOS transistor, to reduce the variation of an output current of the buffer circuit resulting from changes of the supply voltage.

2. The buffer circuit according to claim 1, wherein the high voltage diode connected composite transistors comprises:
    a fourth PMOS transistor and a fifth PMOS transistor, the source of the fourth PMOS transistor is an input end of the high voltage diode connected composite transistors, the drain of the fifth PMOS transistor is an output end of the high voltage diode connected composite transistors, the drain of the fourth PMOS transistor connecting to the source of the fifth PMOS transistor, the gate of the fourth PMOS transistor, the gate of the fifth PMOS transistor and the output end of the high voltage diode connected composite transistors being connected.

3. The buffer circuit according to claim 2, wherein the fourth PMOS transistor in the high voltage diode connected composite transistors is a low-voltage PMOS transistor, and the fifth PMOS transistor in the composite diode connected transistors is a high-voltage PMOS transistor.

4. The buffer circuit according to claim 3, further comprising:
    a resistor, the resistor connecting to the output end of the high voltage diode connected composite transistors, and the gate of the first PMOS transistor and the gate of the second PMOS transistor.

5. The buffer circuit according to claim 1, further comprising:
    a current boosting circuit, connecting to the high voltage constant current buffer circuit and a pulse generator, and receiving a switch signal from the pulse generator;
    wherein the pulse generator outputs a narrow pulse signal to turn on the second NMOS transistor to drive a PMOS current mirror of the current boosting circuit, and the current mirror directly outputs the current to boost the output current of the high voltage constant current buffer circuit;
    wherein the pulse generator outputs the narrow pulse signal to the current boosting circuit when an input signal of the pulse generator transits from low to high, and the current boosting circuit boosts and then outputs the received output current of the high voltage constant current buffer circuit.

6. The buffer circuit according to claim 5, wherein the current boosting circuit comprises:
    a PMOS current mirror;
    a second NMOS transistor, the drain of the second NMOS transistor connecting to the PMOS current mirror, and the gate of the second NMOS transistor connecting to the pulse generator; and
    a third NMOS transistor, the drain of the third NMOS transistor connecting to source of the second NMOS transistor, the source of the third NMOS transistor being grounded, and the gate of the third NMOS transistor receiving a buffer bias voltage;
    wherein the pulse generator outputs the switch narrow pulse signal to the second NMOS transistor to turn on the second NMOS transistor when the input signal of the pulse generator transits from low to high, such that the third NMOS transistor provides an extra current to the PMOS current mirror to boost the output current received by the high voltage constant current buffer circuit from the current boosting circuit, and then the boosted current is outputted from the high voltage constant current buffer circuit.

7. The buffer circuit according to claim 6, wherein the second NMOS transistor is a high-voltage NMOS transistor.

8. The buffer circuit according to claim 6, wherein the PMOS current mirror comprises a sixth PMOS transistor and a seventh PMOS transistor, the gate of the sixth PMOS transistor connecting to the gate of the seventh PMOS transistor, the source of the sixth PMOS transistor and the source of the seventh PMOS transistor both connecting to the supply voltage input of the buffer circuit, and gates and drains of the sixth PMOS transistor and the seventh PMOS transistor all connecting to drain of the second NMOS transistor.

9. The buffer circuit according to claim 6, wherein the sixth PMOS transistor is a low-voltage PMOS transistor and the seventh PMOS transistor is a high-voltage PMOS transistor.

10. The buffer circuit according to claim 1, wherein the voltage range is from 4.5V to 30V.

* * * * *